US009496378B2

(12) United States Patent
Tang et al.

(10) Patent No.: US 9,496,378 B2
(45) Date of Patent: Nov. 15, 2016

(54) IGBT WITH BURIED EMITTER ELECTRODE

(71) Applicant: Infineon Technologies Americas Corp., El Segundo, CA (US)

(72) Inventors: Yi Tang, Torrance, CA (US); Niraj Ranjan, El Segundo, CA (US); Chiu Ng, El Segundo, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/002,267

(22) Filed: Jan. 20, 2016

(65) Prior Publication Data

US 2016/0155832 A1 Jun. 2, 2016

Related U.S. Application Data

(62) Division of application No. 13/791,589, filed on Mar. 8, 2013, now Pat. No. 9,245,985.

(60) Provisional application No. 61/616,986, filed on Mar. 28, 2012.

(51) Int. Cl.

| H01L 29/739 | (2006.01) |
|---|---|
| H01L 29/06 | (2006.01) |
| H01L 29/08 | (2006.01) |
| H01L 29/10 | (2006.01) |
| H01L 29/417 | (2006.01) |
| H01L 29/45 | (2006.01) |

(52) U.S. Cl.
CPC ....... *H01L 29/7397* (2013.01); *H01L 29/0696* (2013.01); *H01L 29/0821* (2013.01); *H01L 29/1004* (2013.01); *H01L 29/1095* (2013.01); *H01L 29/41708* (2013.01); *H01L 29/45* (2013.01)

(58) Field of Classification Search
CPC ........... H01L 29/7397; H01L 29/1095; H01L 29/7395; H01L 2924/13055; H01L 29/7393; H01L 29/7396
See application file for complete search history.

(56) References Cited

U.S. PATENT DOCUMENTS

| 5,471,075 | A  * | 11/1995 | Shekar  | H01L 29/0839 257/139 |
|---|---|---|---|---|
| 6,649,975 | B2 * | 11/2003 | Baliga | H01L 23/552 257/327 |
| 6,747,295 | B2 * | 6/2004 | Inoue | H01L 29/7397 257/133 |
| 7,465,986 | B2 * | 12/2008 | Girdhar | H01L 29/407 257/330 |
| 7,615,846 | B2 * | 11/2009 | Harada | H01L 29/7397 257/578 |
| 8,058,670 | B2 * | 11/2011 | Hshieh | H01L 29/0619 257/136 |

(Continued)

*Primary Examiner* — Jaehwan Oh
(74) *Attorney, Agent, or Firm* — Murphy, Bilak & Homiller, PLLC

(57) ABSTRACT

There are disclosed herein various implementations of an insulated gate bipolar transistor (IGBT) with buried emitter electrodes. Such an IGBT may include a collector at a bottom surface of a semiconductor substrate, a drift region having a first conductivity type situated over the collector, and a base layer having a second conductivity type opposite the first conductivity type situated over the drift region. In addition, such an IGBT may include deep insulated trenches extending from a semiconductor surface above the base layer, into the drift region, each of the deep insulated trenches having a buried emitter electrode disposed therein. The IGBT may further include an active cell including an emitter, a gate trench with a gate electrode disposed therein, and an implant zone situated, between adjacent deep insulated trenches. The implant zone is formed below the base layer and has the first conductivity type.

19 Claims, 5 Drawing Sheets

(56) References Cited

U.S. PATENT DOCUMENTS

| | | | |
|---|---|---|---|
| 8,232,610 B2* | 7/2012 | Nakazawa | H01L 27/0255 257/287 |
| 9,245,985 B2* | 1/2016 | Tang | H01L 29/7397 |
| 9,299,819 B2* | 3/2016 | Tang | H01L 29/7397 |
| 2004/0084722 A1* | 5/2004 | Yamaguchi | H01L 29/0696 257/330 |
| 2009/0283797 A1* | 11/2009 | Takahashi | H01L 29/7397 257/139 |
| 2011/0220962 A1* | 9/2011 | Koyama | H01L 29/0696 257/139 |
| 2011/0233684 A1* | 9/2011 | Matsushita | H01L 29/1095 257/378 |
| 2012/0217541 A1* | 8/2012 | Hsieh | H01L 29/7397 257/140 |
| 2013/0256744 A1* | 10/2013 | Tang | H01L 29/7397 257/139 |
| 2013/0256745 A1* | 10/2013 | Tang | H01L 29/7397 257/139 |

* cited by examiner

IGBT WITH BURIED EMITTER ELECTRODE

RELATED APPLICATIONS

This is a divisional of application Ser. No. 13/791,589 filed Mar. 8, 2013, which itself claims benefit of and priority to U.S. Provisional Patent Application Ser. No. 61/616,986 filed on Mar. 28, 2012. The disclosures in the above-identified patent applications are hereby incorporated fully by reference into the present application.

BACKGROUND

Insulated-gate semiconductor devices, such as insulated-gate bipolar transistors (IGBTs) may be implemented in a variety of power applications. For example, IGBTs may be used as power switches in motor drive inverters. In such power applications, the collector-to-emitter saturation voltage ($V_{CE(on)}$) and short-circuit withstand time ($T_{SC}$) are typically key operating parameters. In motor drive inverters, for example, a long $T_{SC}$ is typically desirable in order to enable detection of a motor fault condition and to allow time for system shutdown without damage to the system.

$T_{SC}$ is known to depend inversely on IGBT saturation current, which in turn depends on the channel density of the IGBT. Thus, a reduction in channel density and saturation current can result in a corresponding advantageous increase in $T_{SC}$. However, reductions in channel density and saturation current typically have the undesirable effect of increasing $V_{CE(on)}$, thereby reducing IGBT efficiency.

SUMMARY

The present disclosure is directed to an insulated-gate bipolar transistor (IGBT) with buried emitter electrode, substantially as shown in and/or described in connection with at least one of the figures, and as set forth more completely in the claims.

DETAILED DESCRIPTION

Figure 1A:
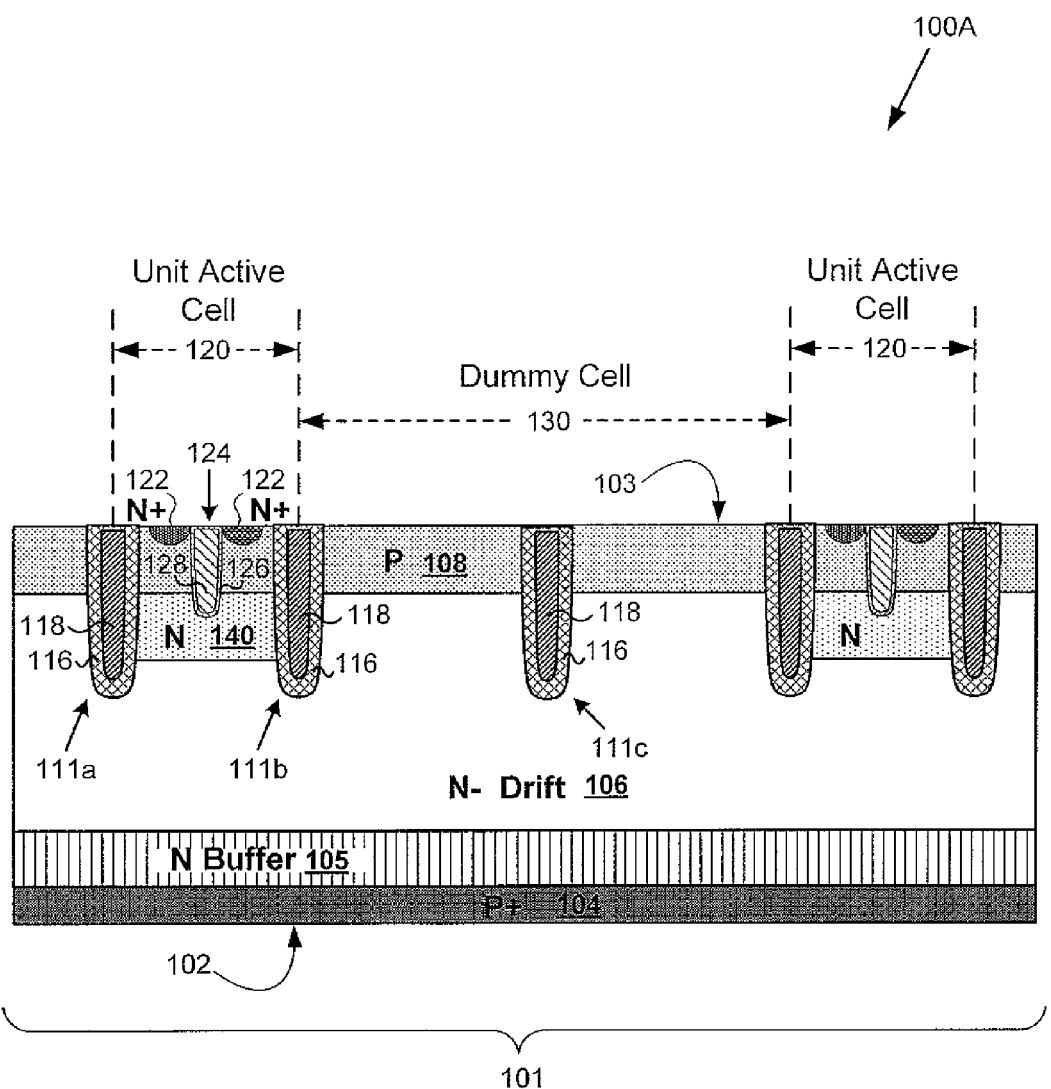
FIG. 1A presents a cross-sectional view of an exemplary insulated-gate bipolar transistor (IGBT) structure including buried emitter electrodes, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As previously discussed, insulated-gate semiconductor devices, such as insulated gate bipolar transistors (IGBTs) can be implemented in a variety of power applications for which collector-to-emitter saturation voltage ($V_{CE(on)}$) and short-circuit withstand time ($T_{SC}$) are important parameters. As further noted above, $T_{SC}$ is known to depend inversely on IGBT saturation current, which depends in turn on the channel density of the IGBT. As a result, a reduction in channel density and saturation current can result in a corresponding advantageous increase in $T_{SC}$, rendering the IGBT more durable. However, reductions in channel density and saturation current typically have the undesirable effect of increasing $V_{CE(on)}$, thereby reducing IGBT efficiency.

The present application discloses implementations of an IGBT with buried emitter electrodes that advantageously enable concurrent improvements in $V_{CE(on)}$ and $T_{SC}$. For example, FIG. 1A presents a cross-sectional view of an IGBT structure including buried emitter electrodes, according to one implementation. It is noted that, although the specific implementations shown and described in the present application are directed to IGBTs, the present inventive principles can be applied to other types of insulated-gate semiconductor devices, such as thyristors, for example.

FIG. 1A shows a portion of IGBT 100A in semiconductor substrate 101. IGBT 100A includes P type collector 104 at bottom surface 102 of semiconductor substrate 101, and N type drift region 106 situated over P type collector 104. In addition, P type base layer 108 is situated over N type drift region 106. IGBT 100A also includes unit active cells 120 and dummy cell 130 neighboring unit active cells 120. It is noted that although FIG. 1A explicitly depicts two unit active cells 120 neighbored by single dummy cell 130, that representation is presented for conceptual clarity. One of ordinary skill in the art will appreciate that IGBT 100A may include many additional unit active cells 120, as well as additional dummy cells 130 neighboring those additional active cells. It is further noted that in some implementations, as shown in greater detail by FIG. 2, two or more unit active cells 120 may adjoin to provide an active cell including a plurality of unit active cells 120.

Semiconductor substrate 101 may be a silicon substrate, for example, and may include N type drift region 106 and P type base layer 108 formed in an epitaxial silicon layer of semiconductor substrate 101. Formation of such an epitaxial silicon layer may be performed by any suitable method, as known in the art, such as chemical vapor deposition (CVD) or molecular beam epitaxy (MBE), for example. More generally, however, N type drift region 106 and P type base layer 108 may be formed in any suitable group IV layer included in semiconductor substrate 101. Thus, in other implementations, N type drift region 106 and P type base layer 108 need not be formed through epitaxial growth, and/or need not be formed of silicon. For example, in one alternative implementation, N type drift region 106 and P type base layer 108 can be formed in a float zone silicon layer of semiconductor substrate 101. In other implementations, N type drift region 106 and P type base layer 108 can be formed in either a strained or unstrained germanium layer formed as part of semiconductor substrate 101. Furthermore, the P type base layer 108 may also be formed by implantation and thermal diffusion. Moreover, in some implementations, semiconductor substrate 101 may include additional layers, such as N type buffer or field stop layer 105 situated between P type collector 104 and N type drift region 106, and/or an optional conductive material formed over dummy cell 130 (conductive material over dummy cell 130 not shown in FIG. 1A).

As shown in FIG. 1A, IGBT 100A includes a plurality of deep insulated trenches 111a, 111b, and 111c extending from semiconductor surface 103 above P type base region 108, into N type drift region 106, wherein insulating film 116 lines each of deep insulated trenches 111a, 111b, and 111c. As further shown in FIG. 1A, each of deep insulated trenches 111a, 111b, and 111c includes buried emitter electrode 118 disposed therein. In addition, IGBT 100A includes a plurality of gate trenches 124 extending from semiconductor surface 103, through P type base layer 108, and into N type drift region 106. Each of gate trenches 124 is lined by gate insulator 126 and includes gate electrode 128 disposed therein. It is noted that, according to the implementation shown in FIG. 1A, gate trenches 124 are shallower than deep insulated trenches 111a, 111b, and 111c, and at most one gate trench 124 is formed between successive deep insulated trenches 111a, 111b, and 111c.

IGBT 100A further includes N type implant zone 140. As shown in FIG. 1A, N type implant zone 140 is formed in N type drift region 106, below P type base layer 108. As further shown in FIG. 1A, N type implant zone 140 extends across each of unit active cells 120 and has a depth deeper than gate trench 124. In addition, IGBT 100A includes N type emitter diffusions 122 selectively formed at semiconductor surface 103, adjacent each gate trench 124.

Thus, each of unit active cells 120 includes N type emitter diffusions 122, gate trench 124 including gate insulator 126 and gate electrode 128, and N type implant zone 140 situated between adjacent deep insulated trenches 111a and 111b. Also shown in FIG. 1A is deep insulated trench 111c in dummy cell 130.

N type emitter diffusions 122 may be selectively formed in P type base layer 108 using any conventional techniques known in the art. For example, phosphorus (P) or arsenic (As) dopants may be implanted into P type base layer 108 and diffused to form N type emitter diffusions 122. Although not explicitly shown in the cross-sectional perspective provided by FIG. 1A, N type emitter diffusions 122 can be electrically connected to corresponding N type emitter diffusions in other unit active cells 120 of IGBT 100A in the third dimension.

N type implant zone 140 may be formed by implantation of N type dopants, such as P or As, for example, into N type drift region 106 between adjacent deep insulated trenches 111a and 111b. In one implementation, for example, N type implant zone 140 may have a doping concentration of from approximately $10^{17}/cm^3$ to approximately $10^{18}/cm^3$. It is noted, however, that N type implant zone 140 does not extend to dummy cell 130. In addition, neither N type emitter diffusions 122 nor gate trenches 124 are present in dummy cell 130. Thus, according to the present implementation, N type implant zone 140, N type emitter diffusions 122, and gate trenches 124 are present only within unit active cells 120.

As shown in FIG. 1A, deep insulated trenches 111a, 111b, and 111c are substantially deeper than gate trench 124. For example, in some implementations, deep insulated trenches 111a, 111b, and 111c may be from approximately one and a half times deeper to approximately twice as deep as gate trench 124.

Gate insulator 126 may be formed using any material and any technique typically employed in the art. For example, gate insulator 126 may be a gate oxide, such as silicon oxide, and may be deposited or thermally grown to produce gate insulator 126. Gate electrode 128 may also be formed using any material typically utilized in the art. For example, gate electrode 128 may be formed of doped polysilicon. As described above by reference to N type emitter diffusions 122, although the electrical connection among gate electrodes 128 of IGBT 100A is not explicitly shown in the cross-sectional perspective provided by FIG. 1A, gate electrodes 128 can be shorted together in the third dimension.

Deep insulated trenches 111a, 111b, and 111c include insulating film 116, which may be a thick insulation layer. Insulating film 116 may be formed of the same material and using the same technique utilized for formation of gate insulator 126. That is to say, insulating film 116 may be formed as a thermally grown oxide, such as silicon oxide. However, it is noted that even when formed of substantially the same dielectric material and formed using substantially the same fabrication technique, insulating film 116 is distinguishable from gate insulator 126 by being formed as a thicker trench insulation than the trench insulation provided by gate insulator 126.

Deep insulated trenches 111a, 111b, and 111c also include buried emitter electrode 118. Buried emitter electrode 118 may be formed of the same material and using the same technique utilized for formation of gate electrode 128. That is to say, buried emitter electrode 118 may be formed of doped polysilicon. More generally, however, buried emitter electrode 118 may be formed of any suitable conductor, such as doped polysilicon, or metal, for example. Each of buried emitter electrodes 118 is electrically shorted to N type emitter diffusions 122 of IGBT 100A in the third dimension (electrical connection not explicitly shown in the cross-sectional perspective of FIG. 1A).

IGBT 100A provides both improved (i.e., longer) $T_{SC}$ and improved (i.e., reduced) $V_{CE(on)}$, concurrently. By situating dummy cell 130 so as to neighbor unit active cells 120, IGBT 100A has a reduced channel density relative to typical IGBT designs from which dummy cell 130 is omitted. Consequently, the saturation current of IGBT 100A is reduced, resulting in an advantageously increased $T_{SC}$. In addition, the presence of N type implant zone 140 in each of unit active cells 120 improves conductivity modulation in IGBT 100A by enhancing the carrier profile in N type drift region 106 in the conducting state, thereby advantageously reducing $V_{CE(on)}$. Moreover, buried emitter electrodes 118 can be used to deplete N type implant zone 140 in the blocking state, when buried emitter electrodes 118 are tied to a low electrical potential, e.g., grounded or at a near ground potential, to support a high breakdown voltage for IGBT 100A.

With respect to the specific implementation shown in FIG. 1A, it is noted that many modifications are possible. For example, although dummy cell 130 is shown to include a single deep insulated trench 111c, that representation is merely exemplary. In other implementations, dummy cell 130 may include more, many more, or fewer than one deep insulated trench 111c. That is to say, dummy cell 130 may include as few as zero, or as many as "n" deep insulated trenches 111c, where "n" is any desired integer value.

Figure 1B:
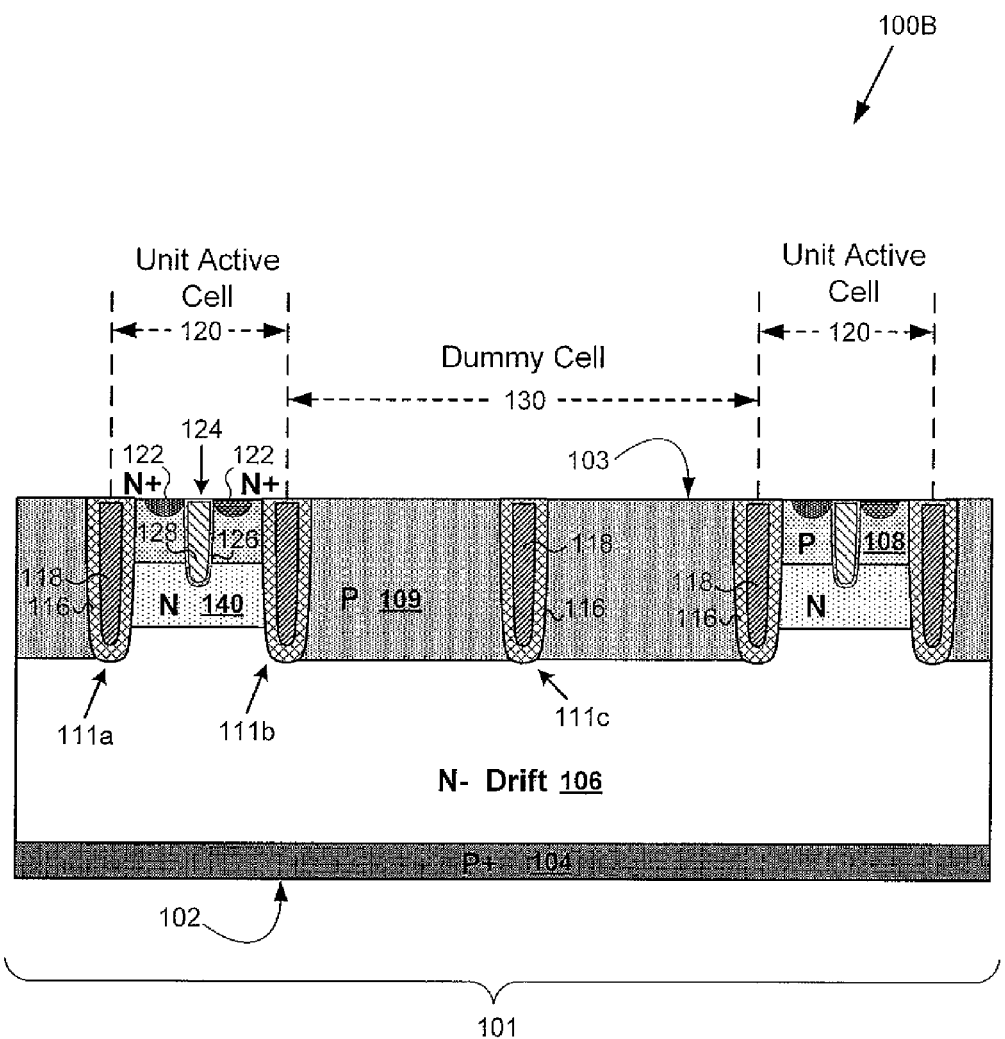
FIG. 1B presents a cross-sectional view of an exemplary IGBT structure including buried emitter electrodes, according to another implementation.

Referring to FIG. 1B, FIG. 1B presents a cross-sectional view of exemplary IGBT structure 100B including buried emitter electrodes, according to another implementation. It is noted that features identified by reference numbers previously shown and described in relation to FIG. 1A, above, correspond respectively to those previously discussed features and may share any of the characteristics attributed to those features above. In contrast to the implementation shown by FIG. 1A, in which P type base layer 108 extends to dummy cell 130, according to the implementation in FIG. 1B, dummy cell 130 may include deep P type diffusion region 109 having a depth deeper than P type base layer 108, such as a depth similar to that of deep insulated trench 111c. Deep P type diffusion region 109 may extend across substantially the entire width of dummy cell 130, as shown in FIG. 1B, or may terminate within dummy cell 130 so as to leave a gap between deep P type diffusion region 109 and its nearest neighbor deep insulated trench of unit active cells 120, i.e. deep insulated trench 111a and 111b.

Figure 1C:
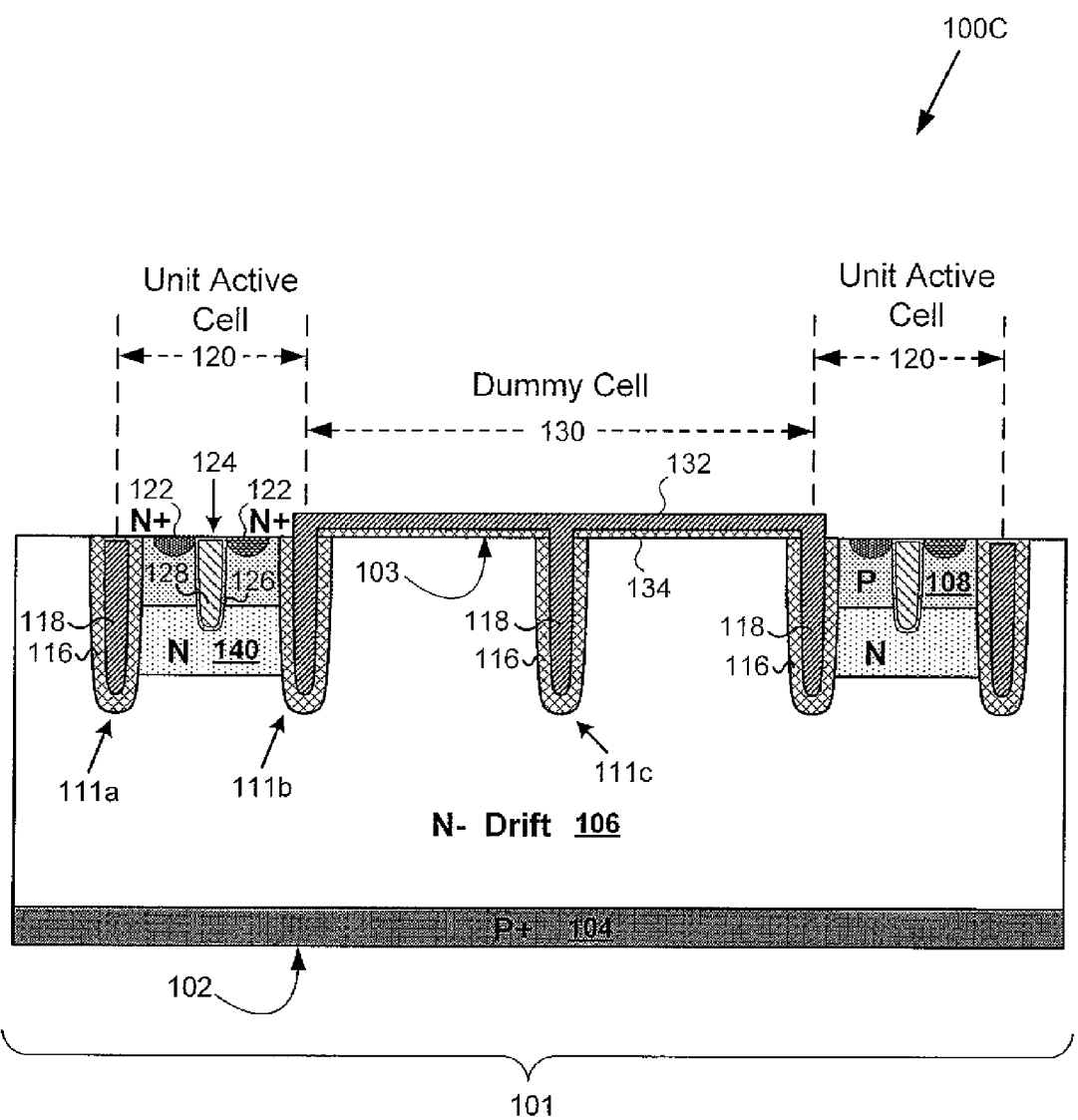
FIG. 1C presents a cross-sectional view of an exemplary IGBT structure including buried emitter electrodes, according to another implementation.

Moving to FIG. 1C, FIG. 1C presents a cross-sectional view of exemplary IGBT structure 100C including buried emitter electrodes, according to another implementation. It is noted that features identified by reference numbers previously shown and described in relation to FIGS. 1A and/or 1B, above, correspond respectively to those previously discussed features and may share any of the characteristics attributed to those features above.

Like the implementation shown in FIG. 1B, P type base layer 108 does not extend to dummy cell 130 in IGBT structure 100C of FIG. 1C. However, unlike IGBT structure 100B, IGBT structure 100C also omits deep P type diffusion region 109 from dummy cell 130. According to the implementation shown in FIG. 1C, N type drift region 106 extends upward in dummy cell 130 to semiconductor surface 103. In addition, optional conductive material 132 may be formed over semiconductor surface 103 in dummy cell 103, and may be electrically insulated from semiconductor surface 103 by insulator layer 134. Insulator layer 134 may be formed of silicon oxide or silicon nitride, while conductive material 132 may be formed of polysilicon. It is noted that, as shown in FIG. 1C, optional conductive material 132 may be shorted to buried emitter electrode 118 in deep insulated trenches 111a, 111b, and 111c.

Figure 2:
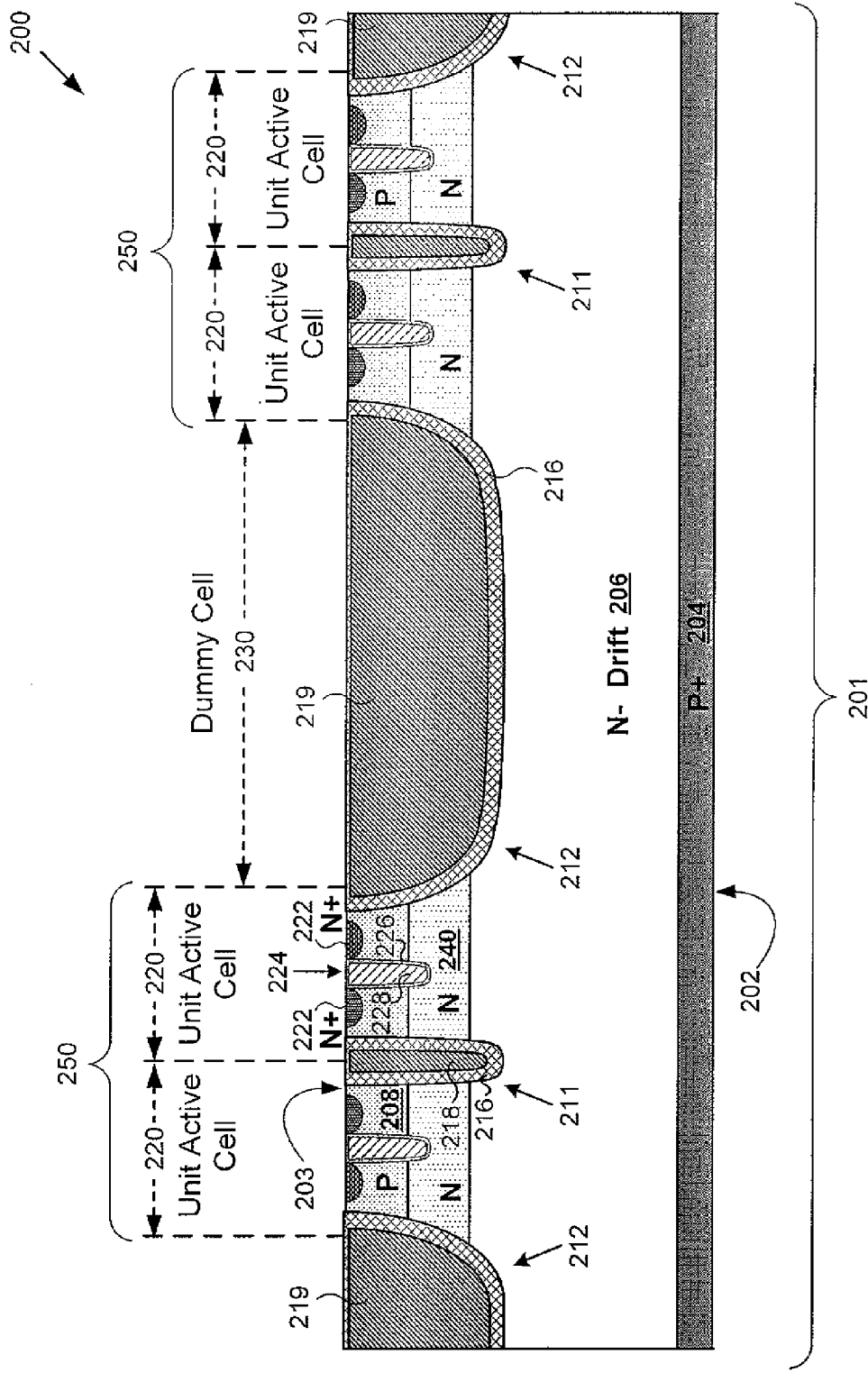
FIG. 2 presents a cross-sectional view of another exemplary IGBT structure including buried emitter electrodes.

Referring now to FIG. 2, FIG. 2 presents a cross-sectional view of another exemplary IGBT structure including buried emitter electrodes. IGBT 200 includes P type collector 204 at bottom surface 202 of semiconductor substrate 201, and N type drift region 206 situated over P type collector 204. In addition, P type base layer 208 is situated over N type drift region 206. IGBT 200 also includes active cells 250, each of which includes adjoining unit active cells 220. Each of unit active cells 220 includes N type emitter diffusions 222, gate trench 224 including gate insulator 226 and gate electrode 228, and N type implant zone 240. It is noted that although the present exemplary implementation depicts active cells 250 as including two adjoining unit active cells 220, in other implementations, active cells 250 may include as few as one unit active cell 220, or may include more than two adjoining unit active cells 220.

Active cells 250 are situated adjacent dummy cells 230, the substantial entirety of which, according to the implementation of FIG. 2, are formed by wide deep insulated trenches 212. Also shown in FIG. 2 are insulating film 216, buried emitter electrode 218 disposed in deep insulated trench 211, and wide buried emitter electrode 219 disposed in wide deep insulated trench 212.

Semiconductor substrate 201 corresponds to semiconductor substrate 101, in FIGS. 1A, 1B, and 1C. That is to say, P type collector 204, N type drift region 206, P type base layer 208, and N type implant zones 240, in FIG. 2, correspond respectively to P type collector 104, N type drift region 106, P type base layer 108, and N type implant zones 140, in FIGS. 1A, 1B, and 1C, and, thus, may share any of the characteristics previously attributed to those corresponding features, above. In addition, N type emitter diffusions 222, gate trench 224 including gate insulator 226 and gate electrode 228, and deep insulated trench 211 including insulating film 216 and buried emitter electrode 218, in FIG. 2, correspond respectively to N type emitter diffusions 122, gate trench 124 including gate insulator 126 and gate electrode 128, and either of deep insulated trenches 111a and 111b including insulating film 116 and buried emitter electrode 118, in FIGS. 1A, 1B, and 1C.

IGBT 200, in FIG. 2, differs from IGBT 100A, IGBT 100B, and IGBT 100C in respective FIGS. 1A, 1B, and 1C, in that substantially the entirety of dummy cell 230 is formed as wide deep insulated trench 212 including wide buried emitter electrode 219. Like deep insulated trench 211, wide deep insulated trench 212 extends from surface 203 into N type drift region 206. Also like deep insulated trench 211, wide deep insulated trench 212 may be substantially deeper than gate trench 224. For example, in some implementations, wide deep insulated trench 212 may be from approximately one and a half times deeper to approximately twice as deep as gate trench 224.

Like buried emitter electrode 218, wide buried emitter electrode 219 may be formed of the same material and using the same technique utilized for formation of gate electrode 228. That is to say, wide buried emitter electrode 219 may be formed of doped polysilicon. More generally, however, like buried emitter electrode 218, wide buried emitter electrode 219 may be formed of any suitable conductor, such as doped polysilicon, or metal, for example. Buried emitter electrode 218 and wide buried emitter electrode 219 are shorted to N type emitter diffusions 222 of IGBT 200 in the third dimension (electrical connections not explicitly shown in the cross-sectional perspective of FIG. 2).

Figure 3:
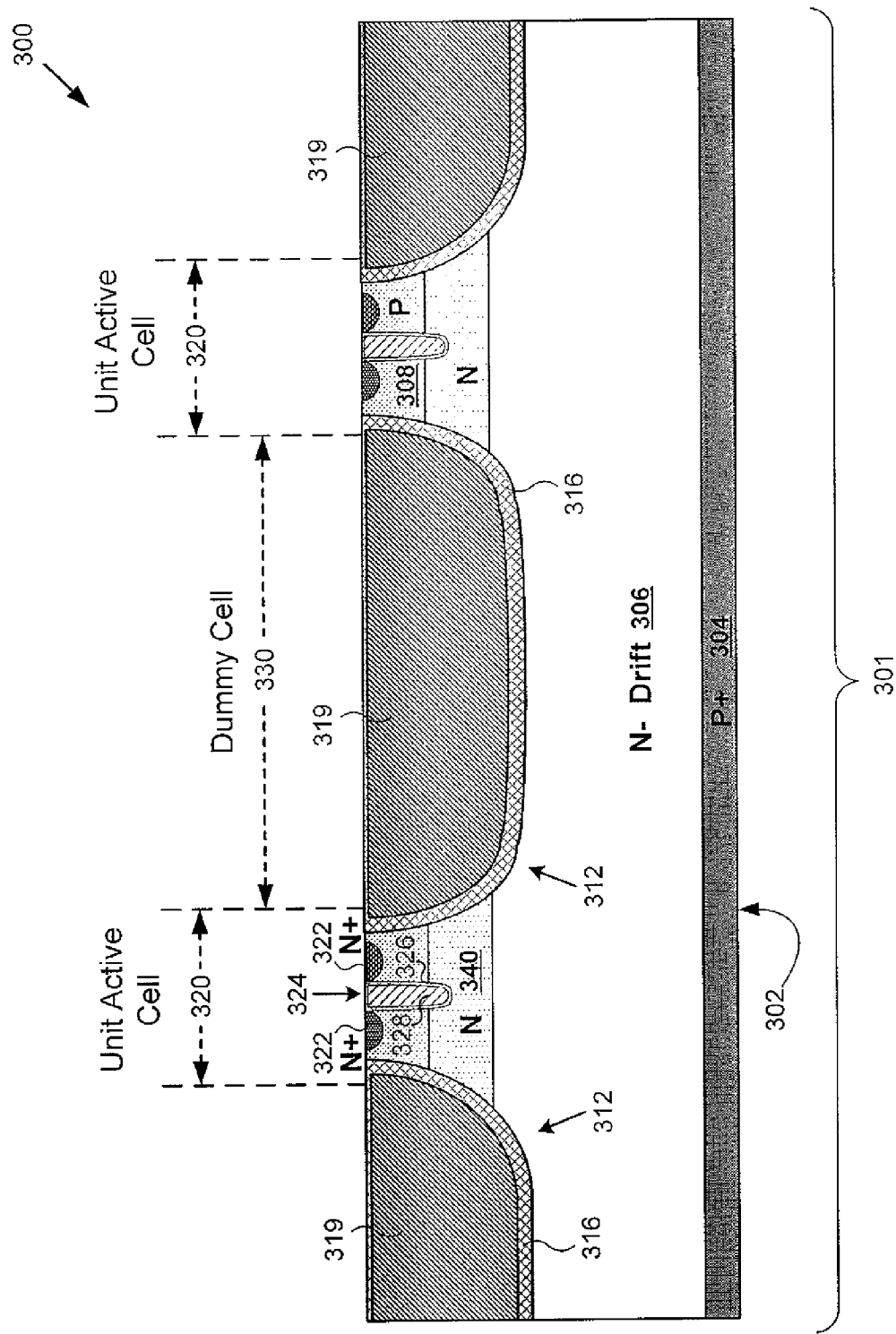
FIG. 3 presents a cross-sectional view of yet another exemplary IGBT structure including buried emitter electrodes.

Continuing to FIG. 3, FIG. 3 presents a cross-sectional view of yet another exemplary IGBT structure including buried emitter electrodes. IGBT 300 includes P type collector 304 at bottom surface 302 of semiconductor substrate 301, and N type drift region 306 situated over P type collector 304. In addition, P type base layer 308 is situated over N type drift region 306. IGBT 300 also includes unit active cells 320, each of which includes N type emitter diffusions 322, gate trench 324 including gate insulator 326 and gate electrode 328, and N type implant zone 340 situated between wide deep insulated trenches 312 that form the substantial entirety of dummy cells 330. Also shown in FIG. 3 are insulating film 316 and wide buried emitter electrode 319 disposed in each of wide deep insulated trenches 312.

Semiconductor substrate 301 corresponds to semiconductor substrate 101, in FIGS. 1A, 1B, and 1C. That is to say, P type collector 304, N type drift region 306, P type base layer 308, and N type implant zones 340, in FIG. 3, correspond respectively to P type collector 104, N type drift region 106, P type base layer 108, and N type implant zones 140, in FIGS. 1A, 1B, and 1C, and, thus, may share any of the characteristics previously attributed to those corresponding features, above. In addition, N type emitter diffusions 322, insulating film 316, and gate trench 324 including gate insulator 326 and gate electrode 328, in FIG. 3, correspond respectively to N type emitter diffusions 122, insulating film 116, and gate trench 124 including gate insulator 126 and gate electrode 128, in FIGS. 1A, 1B, and 1C. Furthermore, it is noted that wide deep insulated trenches 312 including insulating film 316 and wide buried emitter electrodes 319 correspond to wide deep insulated trenches 212 including insulating film 216 and wide buried emitter electrodes 219, in FIG. 2.

IGBTs 200 and 300 are capable of providing both improved (i.e., longer) $T_{SC}$ and improved (i.e., reduced)

$V_{CE(on)}$, concurrently. By implementing deep insulated trenches 212 as wide deep insulated trench, IGBT 200 has a reduced channel density relative to conventional IGBT designs. By implementing deep insulated trenches 312 as wide deep insulated trenches, IGBT 300 reduces channel density further yet. Consequently, the saturation current of IGBT 200 is reduced, and that of IGBT 300 still further reduced, resulting in respective advantageous increases in $T_{SC}$. In addition, the presence of implant zone 240/340 in each of active cells 220/320 improves conductivity modulation in IGBTs 200 and 300 by enhancing the carrier profile in N type drift region 206/306 in the conducting state, thereby advantageously reducing $V_{CE(on)}$. Moreover, buried emitter electrodes 218 and 219/319 can be used to deplete implant zone 240/340 in the blocking state, when buried emitter electrodes 218 and 219/319 are tied to a low electrical potential, e.g., grounded or at a near ground potential, to support a high breakdown voltage for IGBTs 200 and 300. As an additional advantage, any of the exemplary IGBT implementations shown by FIGS. 1A, 1B, 1C, 2, and 3 may be used to produce a punch-through IGBT, a non-punch-through IGBT, or a field stop IGBT. Consequently, the present inventive concepts may be implemented across a wide variety of IGBT applications. Moreover, as noted above, the present inventive concepts can be applied to other types of insulated-gate semiconductor devices, such as thyristors, for example.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. An insulated-gate bipolar transistor (IGBT) in a semiconductor substrate, said IGBT comprising:
   a collector at a bottom surface of said semiconductor substrate, a drift region having a first conductivity type situated over said collector, and a base layer having a second conductivity type opposite said first conductivity type situated over said drift region;
   a plurality of deep insulated trenches extending from a semiconductor surface above said base layer, into said drift region, each of said deep insulated trenches having a buried emitter electrode disposed therein;
   an active cell including an emitter, a gate trench with gate electrode disposed therein, and an implant zone, situated between adjacent deep insulated trenches;
   said implant zone being formed below said base layer and having said first conductivity type;
   a dummy cell neighboring said active cell, said dummy cell having neither an emitter diffusion nor a gate trench formed therein.

2. The IGBT of claim 1, wherein said implant zone does not extend to said dummy cell.

3. The IGBT of claim 1, wherein said buried emitter electrode comprises doped polysilicon.

4. The IGBT of claim 1, wherein said dummy cell includes at least one deep insulated trench with a respective buried emitter electrode disposed therein.

5. The IGBT of claim 1, wherein said dummy cell includes a region having said second conductivity type, but having a depth deeper than said base layer.

6. The IGBT of claim 1, wherein said base layer extends to said dummy cell.

7. The IGBT of claim 1, wherein said base layer is not formed in said dummy cell.

8. The IGBT of claim 1, wherein a conductive material is formed over said dummy cell, said conductive material being electrically insulated from said semiconductor surface.

9. The IGBT of claim 1, wherein a substantial entirety of said dummy cell is formed by a wide trench with a buried emitter electrode disposed therein.

10. The IGBT of claim 1, wherein said active cell includes at least two adjoining unit active cells separated by one of said plurality of deep insulated trenches.

11. The IGBT of claim 1, further comprising a buffer layer of said first conductivity type formed between said drift region and said collector.

12. An insulated-gate bipolar transistor (IGBT) in a semiconductor substrate, said IGBT comprising:
   a collector at a bottom surface of said semiconductor substrate, a drift region having a first conductivity type situated over said collector, and a base layer having a second conductivity type opposite said first conductivity type situated over said drift region;
   an active cell including an emitter, a gate trench with gate electrode disposed therein, and an implant zone having said first conductivity type, situated between adjacent deep insulated trenches;
   a dummy cell neighboring said active cell, said implant zone not extending to said dummy cell, wherein neither an emitter diffusion nor said base layer is formed in said dummy cell;
   each of said adjacent deep insulated trenches having a buried emitter electrode disposed therein.

13. The IGBT of claim 12, wherein said buried emitter electrode comprises doped polysilicon.

14. The IGBT of claim 12, wherein said dummy cell includes at least one deep insulated trench with a respective buried emitter electrode disposed therein.

15. The IGBT of claim 12, wherein said dummy cell includes a region having said second conductivity type, but having a depth deeper than said base layer.

16. The IGBT of claim 12, wherein a conductive material is formed over said dummy cell, said conductive material being electrically insulated from a surface of said dummy cell.

17. The IGBT of claim 12, wherein a substantial entirety of said dummy cell is formed by a wide trench with a buried emitter electrode disposed therein.

18. The IGBT of claim 12, wherein said active cell includes at least two adjoining unit active cells.

19. The IGBT of claim 12, further comprising a buffer layer having said first conductivity type formed between said drift region and said collector.

* * * * *